United States Patent
Chen et al.

[11] Patent Number: 5,700,708
[45] Date of Patent: Dec. 23, 1997

[54] PROCESS FOR FABRICATING STORAGE CAPACITOR FOR DRAM MEMORY CELL

[75] Inventors: Hwi-Huang Chen; Gary Hong, both of Hsinchu, Taiwan

[73] Assignee: United Microelectronics Corporation, Hsinchu, Taiwan

[21] Appl. No.: 665,386

[22] Filed: Jun. 18, 1996

[30] Foreign Application Priority Data

May 6, 1996 [TW] Taiwan ................... 85105360

[51] Int. Cl.$^6$ .............................. H01L 21/8242
[52] U.S. Cl. .............. 437/52; 437/60; 437/919; 437/47
[58] Field of Search .................. 437/52, 60, 919

[56] References Cited

U.S. PATENT DOCUMENTS

| | | | |
|---|---|---|---|
| 5,145,801 | 9/1992 | Chhabra | 437/52 |
| 5,290,726 | 3/1994 | Kim | 437/52 |
| 5,330,928 | 7/1994 | Tseng | 437/52 |
| 5,384,276 | 1/1995 | Ogawa et al. | 437/52 |
| 5,422,295 | 6/1995 | Choi et al. | 437/52 |
| 5,436,188 | 7/1995 | Chen | 437/52 |

FOREIGN PATENT DOCUMENTS

| | | | |
|---|---|---|---|
| 60-85186 | 3/1994 | Japan | 437/52 |

*Primary Examiner*—Chandra Chaudhari
*Assistant Examiner*—Toniae M. Thomas
*Attorney, Agent, or Firm*—Rabin, Champagne & Lynt, P.C.

[57] ABSTRACT

A process for fabricating a storage capacitor for memory cell units of a DRAM memory device to achieve an increased capacitance value. The process includes first forming a transistor including a gate, a source region, and a drain region on the silicon substrate of the device. The gate includes a first polysilicon layer covered by an insulating layer. A silicon nitride layer is formed covering the transistor and a silicon oxide layer is formed on the silicon nitride layer. A contact opening is formed in the silicon oxide layer and the silicon nitride layer which exposes the surface of the transistor drain/source region. The silicon oxide layer has an edge portion extending toward the cavity of the contact opening more than the edge of the silicon nitride layer below it extends. A second polysilicon layer is then formed in the contact opening, covering the exposed drain region, the gate, and the edge portion of the silicon oxide layer and the silicon nitride layer. The second polysilicon layer thus provides the first electrode of the storage capacitor. A dielectric layer is formed on the second polysilicon layer to provide the dielectric of the storage capacitor and a third polysilicon layer is formed on the dielectric layer to provide the second electrode of the storage capacitor.

12 Claims, 5 Drawing Sheets

PROCESS FOR FABRICATING STORAGE CAPACITOR FOR DRAM MEMORY CELL

BACKGROUND OF THE INVENTION

1. Field of the Invention

The invention relates in general to a process for fabricating semiconductor dynamic random access memory (DRAM) integrated circuit (IC) devices. In particular, the invention relates to a process for fabricating a storage capacitor for a memory cell unit of a DRAM IC device that provides increased capacitance.

2. Technical Background

As microprocessors become more and more powerful, the software programs they execute also become more and more complicated, and require ever larger processing memory space. Since DRAMs currently provide the primary operating memory for these microprocessor-based computer systems, the DRAM operating characteristics are critical to the overall performance of an entire computer system. FIG. 1 schematically depicts the circuit diagram of a conventional memory cell unit which, when organized in arrays, forms the storage memory in DRAM devices. As shown in FIG. 1, the typical DRAM memory cell unit comprises an n-type metal-oxide semiconductor field-effect transistor (MOSFET) 10 and a capacitor 12.

As shown in the drawing, the gate of the NMOS transistor 10 is connected to a word line WL of the memory cell array, the source is connected to a bit line BL of the cell array, and the drain is connected to one electrode of the storage capacitor 12, the other electrode of the capacitor 12 being connected to the system ground plane. As persons skilled in the art are aware, an NMOS transistor, such as the one utilized for the memory cell unit of FIG. 1, is a bidirectional switch, and the capacitor is utilized for holding an electric charge signifying the status of a stored data bit.

The semiconductor structural configuration of a storage capacitor for a conventional DRAM device memory cell unit is shown in the cross-sectional schematic view of FIG. 2. The typical capacitor physical structure is briefly examined with reference to this drawing. To fabricate such a capacitor element for the memory cell unit of a DRAM device, a field oxide layer 21, gate oxide layer 22, first polysilicon layer 23, sidewall spacers 24, and source/drain regions 25 of the NMOS transistor are first successively formed over the surface of a silicon substrate 20. After the formation of the transistor, a layer 26 of oxide, such as silicon dioxide ($SiO_2$), is then deposited over the substrate surface. Then, contact openings are formed at designated locations above the source/drain regions 25 by etching. A contact opening is then filled with a second polysilicon layer 27 for providing an external contact for the source/drain region 25 of the transistor element. A dielectric layer 28 is then deposited on top of the second polysilicon layer 27. The dielectric layer 28 can be, for example, a nitride/oxide (NO) layer or oxide/nitride/oxide (ONO) layer. Finally, a third polysilicon layer 29 is then formed atop the dielectric layer 28. Thus, at this stage, the second polysilicon layer 27, the dielectric layer 28, and the third polysilicon layer 29 form the storage capacitor 12 shown in the schematic circuit diagram of FIG. 1. As is well known to those skilled in the art, the capacitance and leakage characteristics of this storage capacitor are important to the performance of the DRAM device which is composed of arrays of memory cell units utilizing these capacitors. Specifically, use of a storage capacitor 12 having a higher capacitance would lead to the following advantages:

1. The possibility of soft errors caused by alpha particles occurring in the memory cell during the data retrieval access period would be greatly reduced.

2. The possibility of undesirable data content change due to inevitable capacitor leakage current in the storage capacitor would be greatly reduced.

3. The capacitor refresh rate can be reduced to increase the duty cycle of the memory device.

Conventional storage capacitors for DRAM memory cell units, such as the one depicted in FIG. 2, suffered from unsatisfactory capacitance characteristics. Specifically, conventional DRAM devices are equipped with memory cell storage capacitors having insufficient capacitance values. These devices require improvement to match the performance requirements of modern microprocessor-based computer systems.

SUMMARY OF THE INVENTION

It is therefore an object of the invention to provide a process for fabricating a storage capacitor for DRAM memory cell that has improved capacitance characteristics.

The invention achieves the above-identified object by providing a process for fabricating a storage capacitor for memory cell units of DRAM memory device that has an increased capacitance value. The process includes the first step of forming a transistor that comprises a gate, a source region, and a drain region on the silicon substrate of the device. The gate includes a first polysilicon layer covered by an insulating layer. A silicon nitride layer is then formed covering the transistor and a silicon oxide layer is formed on the silicon nitride layer. A contact opening is then formed in the silicon oxide layer and the silicon nitride layer, exposing the surface of the transistor drain region such that the silicon oxide layer has its edge extending toward the cavity of the contact opening more than the edge of the silicon nitride layer extends in that direction. A second polysilicon layer is then formed in the contact opening such that it covers the exposed drain region. The second polysilicon layer functions as the first electrode of the storage capacitor. A dielectric layer is formed on the second polysilicon layer and a third polysilicon layer is formed on the dielectric layer, the third polysilicon layer functioning as the second electrode of the storage capacitor.

BRIEF DESCRIPTION OF THE DRAWINGS

Other objects, features, and advantages of the invention will be apparent by way of the following detailed description of the preferred but non-limiting embodiment. The description is made with reference to the accompanied drawings in which.

DETAILED DESCRIPTION OF THE PREFERRED EMBODIMENT

A detailed description of the process of the invention follows with reference to FIGS. 3A–3I, which show cross-sectional views of a memory cell unit for a DRAM device fabricated in accordance with the invention. Note that these schematic drawings are not necessarily presented to the exact physical dimensional scale, as they serve the major purpose of illustrating the process steps of the invention.

Figure 1:
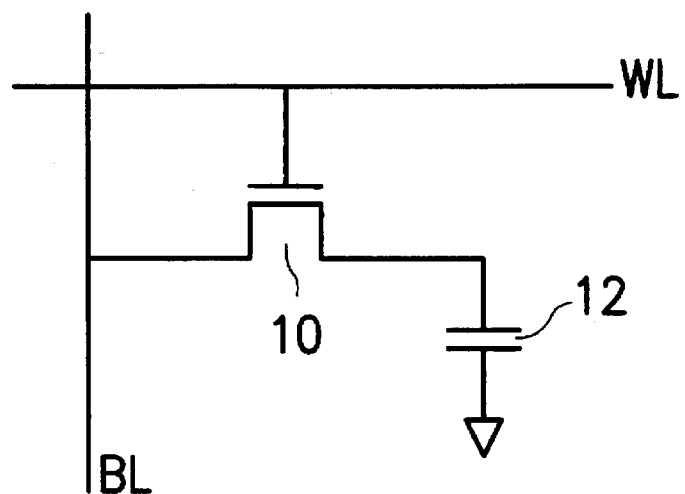
FIG. 1 schematically shows a circuit diagram of a typical memory cell unit of a DRAM device.
Figure 2:
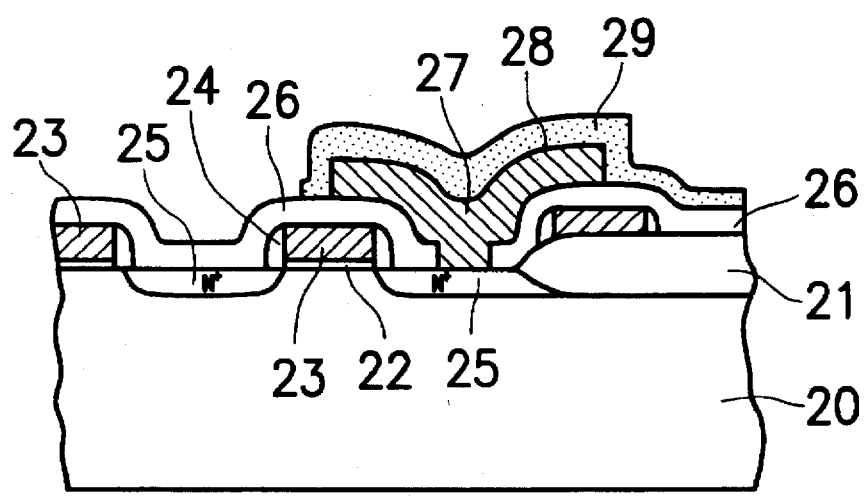
FIG. 2 shows a cross-sectional view of a conventional memory cell unit of a DRAM device.
Figure 3A:
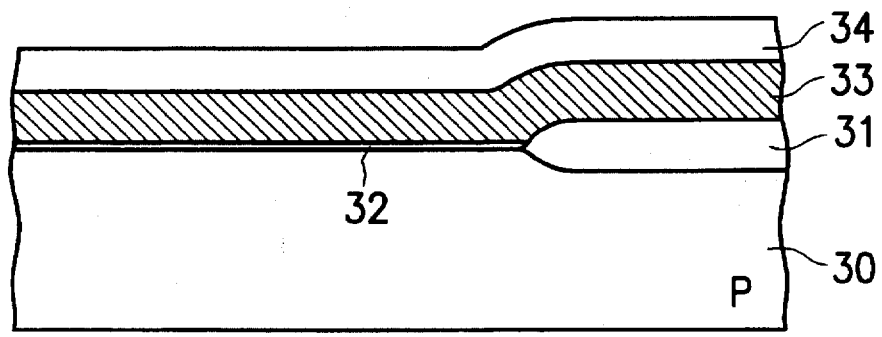
FIGS. 3A–3I show cross-sectional views of a memory cell unit for a DRAM device fabricated in accordance with a preferred embodiment of the invention.

As is seen in FIG. 3A, a silicon substrate 30 is provided as the basis for the construction of the DRAM device. A process of, for example, local oxidation of silicon (LOCOS procedure) is first utilized to form a field oxide layer 31 over the surface of the substrate 30. A gate oxide layer 32 is then formed using a process of, for example, dry oxidation, over the surface of the substrate 30 not covered by the field oxide layer 31. Then, a chemical vapor deposition (CVD) procedure, for example, is utilized to form a first polysilicon layer 33 on top of gate oxide layer 32 and field oxide layer 31. The first polysilicon layer 33 has a thickness of about 1,500–4,000 Å. Another CVD procedure, for example, is then utilized to deposit an insulating layer 34 on top of the first polysilicon layer 33. The insulating layer 34 has a thickness of about 1,000–3,000 Å.

Figure 3B:
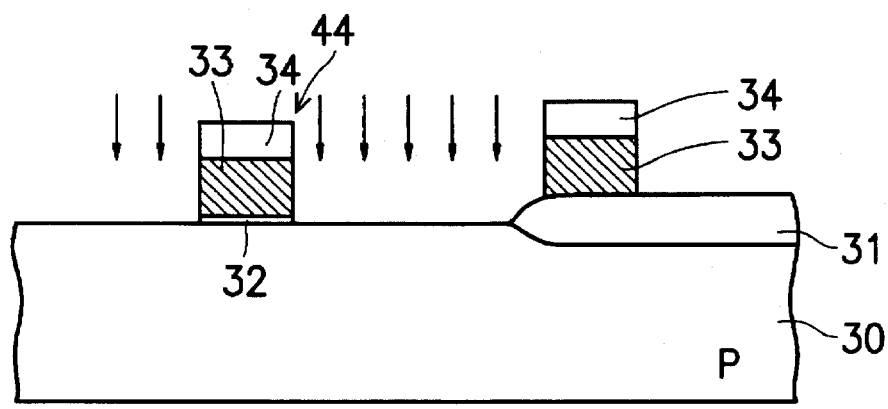

Subsequently, as is seen in FIG. 3B, a photolithography procedure is then utilized to selectively etch into the insulating layer 34, the first polysilicon layer 33, and the gate oxide layer 32, until a portion of the surface of the substrate 30 is exposed. This etching process defines and establishes the gate 44 for the memory cell transistor. Then, an ion implantation procedure is utilized to define the lightly-doped drain/source regions for the cell transistor, implanting low dosage phosphorus or arsenic ions into the drain/source regions.

Figure 3C:
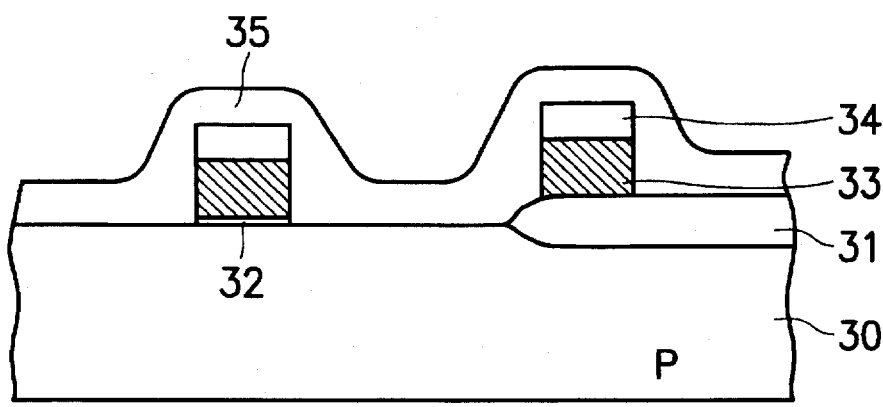

Referring next to FIG. 3C, a CVD procedure, for example, is then utilized to deposit an oxide layer 35 over the surface of the device. This oxide layer 35 thus covers the insulating layer 34 of the transistor gate and the exposed portions of the silicon substrate 30, as well as the field oxide layer 31 and sidewalls of the gate oxide layer 32 and first polysilicon layer 33.

Figure 3D:
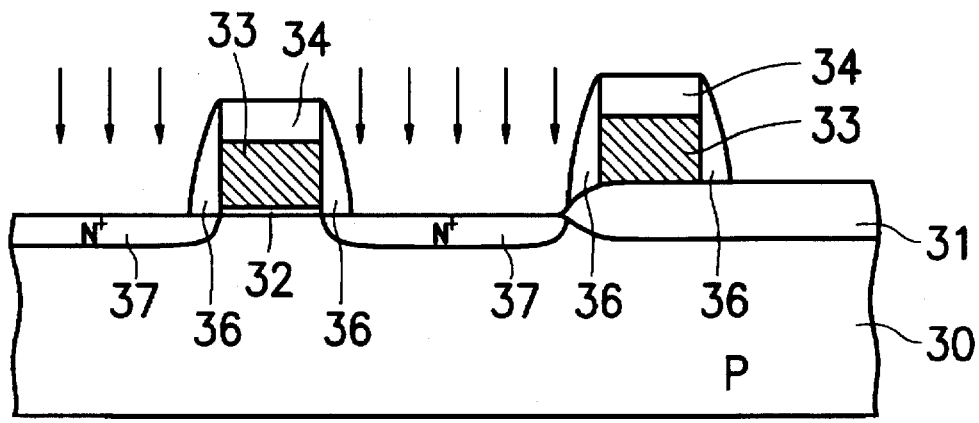

With reference next to FIG. 3D, an etch back procedure is then employed to etch into the oxide layer 35, thus forming the sidewall spacers 36 on the sidewalls of the gate structure 44, which inches the insulating layer 34, the first polysilicon layer 33, and the gate oxide layer 32. Another ion implantation procedure is then conducted to implant high dosage phosphorus or arsenic ions into regions of the exposed substrate, thereby forming the heavily-doped drain/source regions 37. As shown, these drain/source regions 37 are located on either side of the gate structure.

Figure 3E:
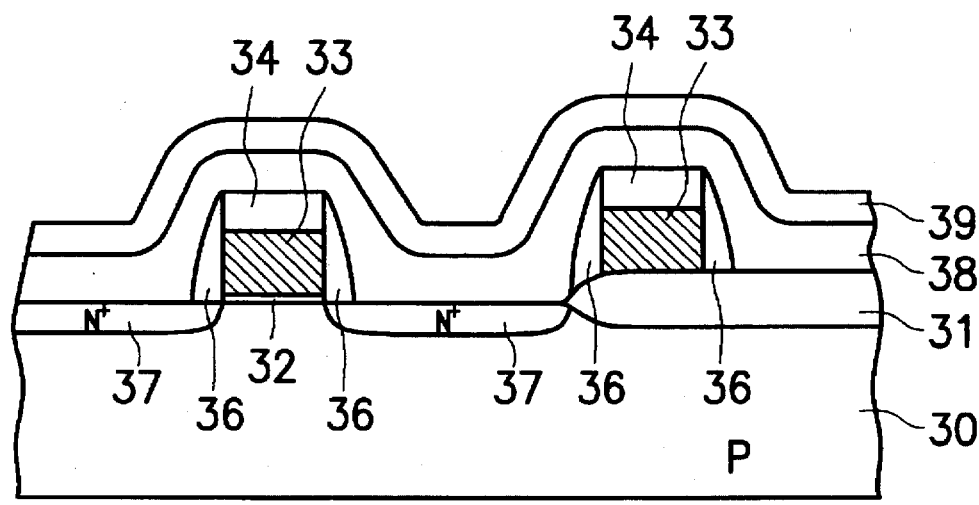

Next, as shown in FIG. 3E, a CVD procedure, for example, is utilized to deposit a silicon nitride layer 38, having a thickness of about 500–2,000 Å, to cover the surface of the device substrate. Thus, the silicon nitride layer 38 covers the exposed surface of the insulating layer 34 of the transistor gate and its sidewall spacers 36, and the exposed surface of the silicon substrate 30, as well as the field oxide layer 31. A silicon oxide layer 39 is then deposited over the surface of the nitride layer 38.

Figure 3F:
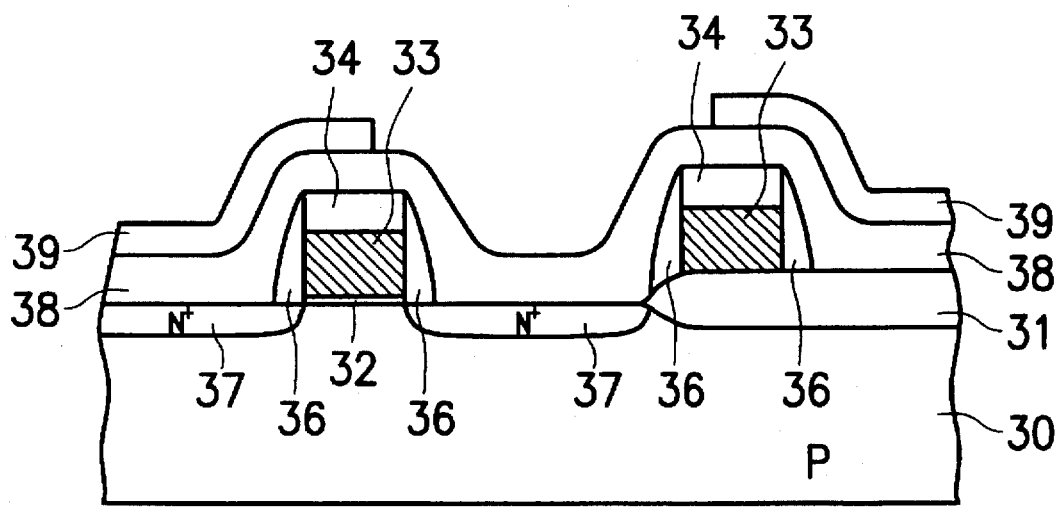

Then, as shown FIG. 3F, another photolithography procedure is employed to remove a portion of the silicon oxide layer 39 so as to expose at least that portion of the surface of the nitride layer 38 overlaying the drain/source region 37. This can be done by conducting the etching of the photolithography procedure by utilizing, for example, HF, buffered oxide etchants, or dry etch.

Figure 3G:
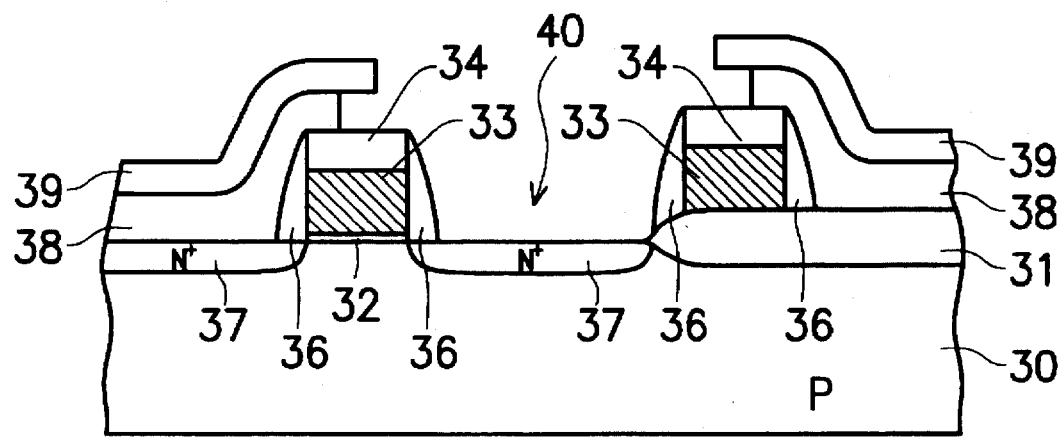

Then, referring to FIG. 3G, the nitride layer 38 is subjected to an etching procedure to form a contact opening 40 over the drain/source region 37. This etching procedure in the nitride layer 38 may be implemented utilizing phosphoric acid, for example. The etching of the nitride layer 38 extends underneath the edge portions of the silicon oxide layer 39, exposing a portion of the insulating layer 34, as is schematically shown in the drawing. Thus, the edge portions of the silicon oxide layer 39 overhang the edge portions of the nitride layer 38.

Figure 3H:
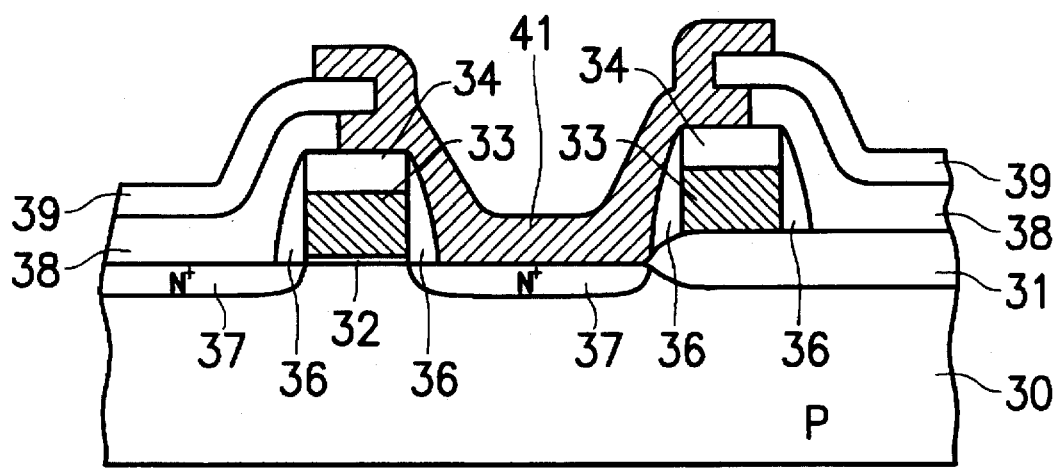

Next, as shown in FIG. 3H, a second polysilicon layer 41 is formed in the contact opening 40, having a thickness of about 1,000–5,000 Å. This second polysilicon layer 41 is then shaped in a photolithography procedure, as shown in the drawing. The second polysilicon layer provides an electrode contact for the drain region 37. The second polysilicon layer 41 is shaped such that it covers the drain region 37, the adjacent spacers 36, the exposed portion of the insulating layer 34, a sidewall of the nitride layer 38, and the edge portion of the silicon oxide layer 39.

Figure 3I:
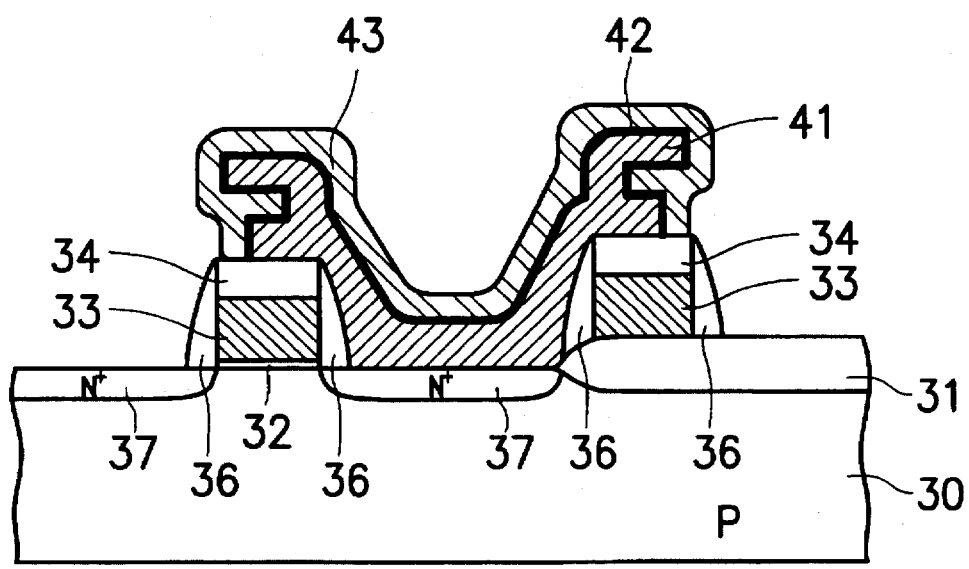

As shown in FIG. 3I, the silicon oxide layer 39 and the nitride layer 38 beneath are then removed, exposing the shaped second polysilicon layer 41. A dielectric layer 42 is then formed on top of the shaped second polysilicon layer 41. This dielectric layer 42 may be an NO or ONO layer having a thickness of about 50–90 Å, and functions as the storage capacitor dielectric for the fabricated DRAM device. A third polysilicon layer 43 is subsequently formed on top of the dielectric layer 42 and is shaped in a photolithography procedure as shown in the drawing. The third polysilicon layer 43 provides another cell plate electrode for the memory cell capacitor.

As shown in the drawings, the formation of the contact opening 40 in the silicon oxide layer 39 and the nitride layer 38, exposing the surface of the transistor drain region 37, results in a configuration wherein the silicon oxide layer 39 has an edge portion extending toward the cavity of the contact opening 40 more than the edge of nitride layer 38 extends toward the cavity. Thus, a fin-shaped configuration for the storage capacitor results. This multiple fin configuration increases the capacitor electrode surface area, which in turn substantially increases the capacitance of the storage capacitor.

Procedural steps after the formation of the storage capacitor as described are still required to conclude the fabrication of a complete DRAM memory device, as persons skilled in the art will appreciate. Since these post fabrication steps are not relevant in the context of the invention, they are not elaborated here.

While the invention has been described by way of example and in terms of a preferred embodiment, it is to be understood that the invention is not limited to the disclosed embodiment. To the contrary, it is intended to cover various modifications and similar arrangements contemplated by those skilled in the art. The scope of the appended claims should therefore be accorded the broadest interpretation so as to encompass all such modifications and similar structures.

What is claimed is:

1. A process for fabricating a storage capacitor for a memory cell unit of a dynamic random access memory semiconductor device, comprising the steps of:
   (a) forming a transistor, including a gate and a drain/source region on a silicon substrate, the gate including a first polysilicon layer covered by an insulating layer;
   (b) forming a silicon nitride layer directly on and covering the transistor;
   (c) forming a silicon oxide layer on the silicon nitride layer;
   (d) forming a contact opening in the silicon oxide layer and the silicon nitride layer to expose a surface of the drain/source region, wherein the silicon oxide layer has an edge portion that extends toward a cavity of the contact opening more than an edge portion of the silicon nitride layer extends toward the cavity;

(e) forming a second polysilicon layer in the contact opening and covering the exposed drain region and the edge portions of the silicon oxide and silicon nitride layers, the second polysilicon layer forming a first electrode of the storage capacitor;

(f) forming a dielectric layer on the second polysilicon layer, the dielectric layer forming the dielectric of the storage capacitor; and (g) forming a third polysilicon layer on the dielectric layer, the third polysilicon layer forming a second electrode of the storage capacitor.

2. The process of claim 1, wherein the silicon oxide layer formed in step (c) has a thickness of about 500–2,000 Å.

3. The process of claim 1, wherein the contact opening formed in step (d) is formed using a selective etching process by etching into the silicon oxide layer.

4. The process of claim 3, wherein the selective etching into the silicon oxide layer is conducted utilizing HF.

5. The process of claim 3, wherein the selective etching into the silicon oxide layer is conducted utilizing a buffered oxide etchant.

6. The process of claim 3, wherein the selective etching into the silicon oxide layer is utilizing dry etch method.

7. The process of claim 1, wherein the formation of a contact opening in step (d) comprises the step of selectively etching into the silicon nitride layer.

8. The process of claim 7, wherein said selective etching is conducted utilizing phosphoric acid.

9. The process of claim 1, wherein the second polysilicon layer has a thickness of about 1,000–5,000 Å.

10. The process of claim 1, wherein the dielectric layer includes a configuration of oxide/nitride layers.

11. The process of claim 1, wherein the dielectric layer includes a configuration of oxide/nitride/oxide layers.

12. The process of claim 1, further including the step of removing the silicon oxide and silicon nitride layers, prior to said step (f).

* * * * *